United States Patent [19]

Yamamoto et al.

[11] Patent Number: 4,859,881
[45] Date of Patent: Aug. 22, 1989

[54] FILTER CIRCUIT

[75] Inventors: Yoshihiro Yamamoto, Tokyo; Tsutomu Kume, Ibaraki; Nobuo Yamazaki; Fumiharu Hashimoto, both of Tokyo; Koichi Ohya, Kanagawa, all of Japan

[73] Assignee: Sony Corporation, Tokyo, Japan

[21] Appl. No.: 138,865

[22] Filed: Dec. 29, 1987

[30] Foreign Application Priority Data

Dec. 29, 1986 [JP] Japan ................. 61-310125
Jan. 8, 1987 [JP] Japan ................. 62-001064

[51] Int. Cl.$^4$ ............... H03K 5/00; H03K 17/56; H03B 1/04; H03F 3/04
[52] U.S. Cl. .................... 307/520; 307/240; 307/556; 328/167; 330/303; 330/306
[58] Field of Search ............ 307/520, 240, 555, 556, 307/543, 521; 328/165, 167, 127; 330/107, 109, 302, 303, 306; 333/173

[56] References Cited

U.S. PATENT DOCUMENTS

| | | | |
|---|---|---|---|
| 3,701,037 | 10/1972 | Holsinger | 330/107 |
| 4,257,006 | 3/1981 | Schaumann | 328/167 |
| 4,284,965 | 8/1981 | Higashi et al. | 330/126 |
| 4,292,468 | 9/1981 | Yokoyama | 330/109 |
| 4,328,591 | 5/1982 | Baghdady | 328/165 |
| 4,429,281 | 1/1984 | Ito et al. | 328/127 |
| 4,513,249 | 4/1985 | Baghdady | 328/150 |
| 4,651,034 | 3/1987 | Sato | 328/167 |
| 4,710,654 | 12/1987 | Saitoh et al. | 328/127 |
| 4,812,733 | 3/1989 | Yamamoto et al. | 328/167 |

OTHER PUBLICATIONS

J. T. Trnka, "Integrating Filter for Threshold Detectors", IBM Technical Disclosure Bulletin vol. 20, No. 8 Jan. 1978.
L. E. Thomas, "the Biquad: Part I–Some Practical Design Considerations," IEEE, vol. CT18, No. 3 May 1971.

Primary Examiner—Stanley D. Miller
Assistant Examiner—Huy Kim Mai
Attorney, Agent, or Firm—Hill, Van Santen, Steadman & Simpson

[57] ABSTRACT

A double integration type filter circuit, consisting of a pair of integrators connected in series with each other, has a changeover switch for commutating the filter characteristics to a filter configuration which emphasizes portions proper to the characteristics of the filter circuit to facilitate filter adjustment to reduce filter adjustment time and to realize improved accuracy while providing for automatic adjustment of the filter characteristics.

19 Claims, 7 Drawing Sheets

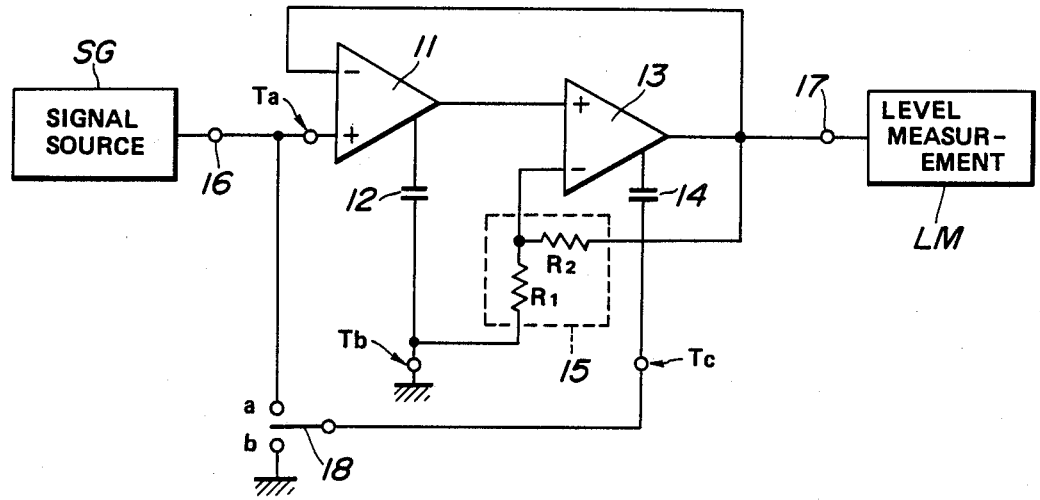

FILTER CIRCUIT

BACKGROUND OF THE INVENTION

1. Field of the Invention

This invention relates to a filter circuit and, more particularly, to a so-called double integration type filter circuit consisting essentially of a pair of integrators connected in series with each other.

2. Description of the Prior Art

In general, in a process of checking an electronic circuit, it may become necessary to adjust the peak frequency, dip frequency or the cut-off frequency of the filter circuit to a prescribed target value. Above all, in a circuit formed in an analog IC, the circuit elements such as transistors, resistors or capacitors may be fabricated with a rather accurate relative ratio of the rated values thereof, but the magnitudes of these rated values usually vary from circuit to circuit. Hence, the aforementioned adjustment is thought to be indispensable in view of a demand for higher accuracy in the filter circuit.

It is noted herein that a double integration type filter circuit as disclosed, for example, in the U.S. Pat. No. 4,472,689, can be built into an IC. The double integration type filter circuit has advantages that a higher accuracy suitable for incorporation into an IC may be realized and that it allows various filter characteristics, including the value of $Q_1$ to be adjusted more easily.

It is noted that, at the time of adjusting the filter circuit, it has so far been necessary to detect portions proper to the characteristic curves, such as so-called cut-off points or peak portions, and to adjust the frequencies of these portions, namely the so-called cut-off or peak frequencies, to prescribed target values. However, it is troublesome or even difficult with the LPF, HPF or the BFP with is low value of Q to locate the cut-off or peak points accurately on the characteristic curves.

Above all, when it is desired to automate such filter adjustment, it is difficult to discriminate and read out mechanically those characteristic portions, such as the aforementioned cut-off points, from the frequency characteristic curves, thus occasionally resulting in lowered adjustment accuracy.

SUMMARY OF THE INVENTION

It is therefore an object of the present invention to provide a filter circuit wherein the portions proper to the filter characteristics can be detected easily and accurately during the filter adjustment.

It is another object of the present invention to provide a filter circuit so designed that the characteristics can be detected easily and accurately during the filter adjustment.

It is another object of the present invention to provide a filter circuit so designed that the characteristics thereof can be adjusted highly accurately and within a reduced adjustment time.

According to the present invention, there is provided a filter circuit comprising a pair of integrators each consisting of an amplifier and an integration capacitance, with the output terminal of the first integrator being connected to the input terminal of the second integrator and with the output terminal of the second integrator being connected to the input terminal of the first integrator and to the input terminal of the said second integrator, wherein an improvement resides in that a changeover switch is provided for commutation of filter characteristics, said changeover switch being commutated during the filter adjustment for providing a filter configuration which will allow for better recognition of the portions proper to filter characteristics.

With the above described filter circuit, the circuit is commutated to a specific filter configuration, such as a trap filter configuration, that allows those portions proper to the filter characteristic to be recognized more easily, or the Q of the filter is increased to provide the characteristics placing an emphasis on the shape of the cut-off, dip or peak portions. In this manner, filter adjustment can be made more easily and accurately.

According to a preferred embodiment of the present invention, optimum adjustment data are obtained on the basis of filter adjustment data associated with the point of intersection of the filter output level with a reference level, while the filter characteristics are changed during application of a constant frequency input signal, so that the adjustment may be completed within a shorter time with a higher adjustment accuracy despite the simplified circuit constitution, and the circuit may be adapted more easily to automation of filter adjustment operations.

BRIEF DESCRIPTION OF THE DRAWINGS

FIG. 1 is a block circuit diagram showing a filter circuit according to an embodiment of the present invention.

FIG. 2 is a chart for explaining the operation of commutating the characteristics of the filter circuit shown in FIG. 1.

FIG. 3 is a circuit diagram showing a practical example of an integrator employed in the filter circuit of FIG. 1.

FIG. 4 is a block circuit diagram showing an analog IC and a filter adjustment system to which the above emobodiment is applied.

FIG. 5 is a chart for explaining the adjustment of the frequency characteristics of the trap filter.

FIG. 6 is a chart for explaining a practical example of the operation of adjustment of the trap filter.

FIG. 7 is a block circuit diagram showing a modified embodiment of the present invention.

FIG. 8 is a chart for explaining the characteristics of the filter circuit of FIG. 7.

FIG. 9 is a block circuit diagram showing another modified embodiment of the present invention.

FIG. 10 is a chart for explaining the operation of the filter circuit of FIG. 9.

FIG. 11 is a block circuit diagram showing still another embodiment of the present invention.

FIG. 12 is a chart for explaining the operation of the filter circuit of FIG. 11.

DESCRIPTION OF THE PREFERRED EMBODIMENT

FIG. 1 is a block circuit diagram showing a filter circuit according to an embodiment of the present invention, and illustrates a so-called biquad filter of the double integration type built into an associated IC. In this figure, a low pass filter LPF is shown, wherein the connection of various circuit portions is commutated and changed, only when the filter adjustment is required, to a filter circuit configuration whose filter characteristics are suitable for filter adjustment and can be detected easily, such as a trap filter circuit configuration, said connection being restored to the original LPF after termination of adjustment.

The biquad filter shown in FIG. 1 is a so-called active filter comprised of a series circuit of a first integrator composed of a first operational amplifier 11 and a first integration capacitance or capacitor 12 and a second integrator composed of a second operational amplifier 13 and a second capacitor 14. The output of the operational amplifier 11 is supplied to a non-inverting input terminal of the operational amplifier 13 while the output of the operational amplifier 13 is fed back to an inverting input terminal of the operational amplifier 11 and the output of the operational amplifier 13 is also fed back to a non-inverting input terminal of the operational amplifier 13 via a feedback circuit 15 having a feedback factor $\beta$. The feedback circuit 15 is composed of a voltage divider composed of resistors $R_1$ and $R_2$, with the resistor $R_2$ being connected to an output terminal of the operational amplifier 13. With the above described arrangement of the double integration type biquad filter, the characteristics of BPF, LPF, HPF, trap or a phase shifter may be realized depending on various combinations of the non-inverting input terminal Ta of the operational amplifier 11, the terminal Tb, i.e. the junction point with the resistor $R_1$, of the capacitor 12 as the integration capacitance, and the terminal Tc of the capacitor 14, being supplied with input signals or grounded. The Table 1 below shows various filter characteristics that may be realized depending on the selection as to supplying the input signals or grounding these terminals Ta, Tb or Tc.

TABLE 1

|  | Ta | Tb | Tc |
|---|---|---|---|
| LPF | supplied with input signals | grounded | grounded |
| BPF | grounded | supplied with input signals | grounded |
| HPF | grounded | grounded | supplied with input signals |
| trap | supplied with input signals | grounded | supplied with input signals |

In the embodiment shown in FIG. 1, input signals are supplied to the non-inverting input terminal Ta of the operational amplifier 11 from a signal source SG through an input terminal 16, while the other terminal of the capacitor 12, i.e. the junction point of the capacitor 12 with the resistor $R_1$, is grounded. The other terminal Tc of the capacitor 14 is connected to a changeover switch 18 so that the aforementioned input signals may be supplied therethrough to the terminal Tc or the terminal Tc may be grounded through selective commutation of the changeover switch 18. In this manner, selection may be made between the trap filter for the intended adjustment of the filter characteristics and the LPF as the intrinsic filter. Thus the input terminal 16 is connected to a select terminal a of the changeover switch 18, while a select terminal b is grounded. The output signals are taken at an output terminal 17 of the operational amplifier 13. The frequency characteristics of the trap filter with the changeover switch 18 being connected to the selected terminal a may be represented by a transfer function $$\frac{s^2 + 1}{s^2 + \beta s + 1}$$

where $S=j(\omega/\omega_o)$, $\omega_o=2\pi f_0$, $\omega=2\pi f$ and $f_0$ is the trap frequency of the trap filter whereas those of the LPF, realized with the changeover switch 18 being connected to the select terminal b, are represented by the transfer function.

$$\frac{1}{s^2 + \beta s + 1}$$

wherein $s=j\omega/\omega_o$, $\omega_o 2\pi f_0$, $\omega=2\pi f$ and $f_0$ is the cut-off frequency of the low pass filter.

Hence, during normal usage of the circuit shown in FIG. 1, the changeover switch 18 is leveled to the terminal b in order to realize the LPF having frequency characteristics shown by the solid line in FIG. 2. During the filter adjustment, the changeover switch 18 is leveled to the terminal a in order to realize trap filter characteristics as indicated by the chain-dotted line in FIG. 2. The output level of the output signals from the output terminal 17 is measured by a level measurement device LM, such as a level meter, for detecting the dip portion proper to the filter characteristics, and the filter adjustment is made until the dip frequency $f_0$ coincides with the prescribed target frequency. In this manner, filter adjustment can be made by using filter characteristics, such as the dip portion of the trap characteristics, that can be detected more easily than, for example, the cut-off point of the LPF, so that filter adjustment can be achieved more easily and accurately.

FIG. 3 shows an example of an integrator used in the above biquad filter. Referring to FIG. 3, the non-inverting input terminal 21 and the inverting input terminal 22 of the operational amplifier 11, 13 of FIG. 2 are connected to the base terminals of transistors 23, 24 cojointly forming a differential amplifier. The current flow in a resistor $R_E$ connected between the emitters of these transistors 23, 24 with the magnitude of the current being related to the input voltage between the terminals 21 and 22. The current equal to the sum of the currents $I_1$, $I_1$ of the constant current sources connected to the emitters of the transistors 23, 24 and the current equal to the difference between the currents $I_1$, $I_1$ flow respectively through diodes 25, 26 connected to the collectors of the transistors 23, 24, respectively. The terminal voltages of these diodes 25, 26 appearing as a function of these currents are applied to the base electrodes of transistors 27, 28 cojointly forming an emitter common differential transistor pair. The common emitter of these transistors 27, 28 is grounded via a constant source 29 of the currents $2I_2$, such that the signal current flowing at the collector side of the differential transistor pair is amplified by a factor if $I_2/I_1$. The collector output of the transistor 28 is taken through a current mirror circuit 30 for changing the capacitor 32 used as the aforementioned integration capacitance. The voltage at one terminal of the capacitor 32 is inputted to a transistor 34 so as to be taken at an output terminal 35. The other terminal 33 of the capacitor 32 is grounded or alternatively an input signal is supplied thereto, as mentioned hereinabove.

In the integrated circuit configuration shown in FIG. 3, by changing the current $I_2$ of the current source 31 on the output side of the current mirror circuit 30 and the constant current source 29, the frequency characteristics of the biquad filter of FIG. 1, more specifically, the trap filter characteristic curve or the low pass filter characteristic curve of FIG. 2, are shifted in the direction parallel to the frequency axis, for adjustment of the cut-off or dip frequencies. At the time of the actual filter adjustment, the changeover switch 18 is leveled to the terminal a for charging the filter characteristics to those of a trap filter for easiness in the detection of those portions proper to the filter characteristic curve.

Referring to FIG. 4, there is shown an embodiment in which the filter circuit of the preceding embodiment is included within an analog IC, such as sound multiplex demodulating IC, employed in, for example, a television receiver. The filter 2 provided in the analog IC 1 of the FIG. 4 corresponds to the biquad filter circuit shown in FIG. 1. It is the frequency characteristics of the filter 2 that are to be adjusted.

Referring to FIG. 4, signals of a constant frequency $f_O$ are supplied from a signal source SG to the filter 2 through an external connection terminal or pin of the analog integrating circuit IC 1. It is noted that the circuit constants of the filter 2, such as the current $I_2$ in the constant current sources 29 and 31, are changed as a function of the filter adjustment data for changing the filter characteristics. The filter 2 shows LPF characteristics, as indicated by the solid line in FIG. 2, during the normal usage thereof. It also shows trap filter characteristics as indicated by the chain-dotted line therein only during the time of filter adjustment. It is noted that the signal frequency $f_0$ from the signal source SG is set so as to be equal to the target adjustment value of the cut-off frequency of the 49F and the dip frequency of the trap filter. Thus, in the present embodiment, filter adjustment is performed so that the cut-off frequency of the dip frequency at the time of filter adjustment will be ultimately equal to the aforementioned constant frequency $f_0$.

The output from the filter 2 is supplied to a level detector 5, such as the so-called AM detector, previously provided in the analog IC 1, for detecting the signal level or amplitude, with the detected level output being supplied to one input terminal, such as the non-inverting input terminal, of the comparator 6, for level discrimination. To the other input terminal, such as the inverting input terminal, of the comparator 6, there is supplied a prescribed reference level $V_{ref}$ through a reference input terminal 7. The comparator 6 discriminates whether the detected output level is higher or lower than the reference level $V_{ref}$. The output from the comparator 6 or the discriminated level output is supplied to an internal bus 40 in the IC 1. A bus decoder 41 connected to the internal bus 40 of the IC 1 is also connected to an external bus 50 through a terminal for external connection 42 so as to be used as an interfacing circuit for exchange of data on the external bus 50 and those on the internal bus 40. The data transmitted from the external bus 50 through the bus decoder 41 to the internal bus 40 are stored in a latch circuit 43 so as to be then converted in a DA converter 44 into analog signals which are supplied to the filter 2 as the circuit constant control signals or as the filter adjustment signals. To the external bus 50, there are connected a CPU 51 such as the microprocessor, a ROM 52 where the programs or data are written in advance, a RAM 53 where data, etc. are written transiently, and a non-volatile memory 54 where filter adjustment data, etc. as later described may be stored positively no matter whether the power source is turned on or off. The computer system mainly composed of the CPU 51, ROM 52, RAM 53 and the non-volatile memory 54, performs a series of control operations, such as commutation of the changeover switch in the filter 2, setting of the filter characteristics used and the selection of the optimum filter adjustment data based on the output from the comparator 6 that is changed with changes in the filter adjustment data.

The operation of finding these optimum filter adjustment data is now explained.

In general, when making the filter adjustment, the aforementioned dip frequency may be detected on the basis of the filter output characteristic curve or the frequency response curve that is obtained when changing or sweeping the input signal frequency with the frequency sweeping being repeated until the dip frequency is equal to the target frequency $f_0$, while the filter characteristics are adjusted, as conventionally. There is, however, proposed in the present embodiment, a system as shown in FIG. 4 wherein filter adjustment can be made automatically and precisely by a circuit of a simpler constitution.

Briefly, the filter adjustment system is so designed that the optimum filter adjustment data are obtained on the basis of those data corresponding to the crossing of the prescribed reference level by the level detection filter output, while the filter characteristics are changed with the input signal being fixed at the constant frequency $f_0$.

Thus, during filter adjustment, the changeover switch 18 in the filter 2 is commutated to the select terminal a by switch commutation data from control means consisting mainly of the CPU 21, in such a manner that the characteristics of the filter 2 are commutated to the aforementioned trap characteristics. FIG. 5 illustrates a characteristic curve of a trap filter obtained upon the aforementioned filter adjustment. The filter characteristics are adjusted so that the frequency of the dip in the characteristic curve of the trap filter will be equal to a prescribed target frequency $f_0$.

It will be noted herein that signals of a constant frequency $f_0$ are supplied from the signal source SG to the filter 2. At this time, filter adjustment data are supplied by a control means consisting of a computer system including the CPU 51 to current control terminals of the constant current sources 29, 31 of the aforementioned integrator in the filter 2 through the bus decoder 11, internal bus 10 in the IC, latch circuits 43A and 43B and the AD converter 44. These adjustment data represent a series of data for gradually shifting the characteristic curves of the filter 2B in one direction, for example, in the direction shown by the arrow mark in the figure, as schematically indicated therein, on the frequency axis. It is noted that changing the frequency characteristics in this manner substantially continuously is tantamount to changing or sweeping the input signal frequency according to the prior art practice.

Conversely, since the input signal frequency is fixed at the constant value $f_0$, the output obtained after level detection of the output signals from the filter 2 at the AM detector 5 is as shown, for example, at the detected output in FIG. 6. The detected output has its level changed in accordance with the changes in the filter adjustment data as indicated on the abcissa in FIG. 4. Thus, the curve of the detected output corresponds to the filter characteristic curve of FIG. 3 supposed to be inverted in the left and right direction in FIG. 3 with the frequency $f_0$ as the center. This detected output is supplied to the non-inverting input terminal of the comparator 6 for comparison with the reference level $V_{ref}$ to produce the comparator output as shown in FIG. 6. When assumed that the filter adjustment data obtained at the inverting position of the comparator output, that is, when the detected output intersects the reference level $V_{ref}$, are sequentially denoted as Da and Db, the optimum adjustment data, that is, the data for the time when the dip frequency of the trap frequency coincides with the aforementioned frequency $f_0$ is obtained from the mean value of the data Da and Db or (Da+Db)/2. These optimum adjustment data are written in the non-volatile memory 54 of FIG. 4 and there stored even when the power source is turned off. As one of the initializing operations usually performed at the time the power source is turned on, the aforementioned optimum adjustment data stored in the non-volatile memory 54 is transmitted to the latch circuit 43 through the buses 50 and 40 for establishing the optimum adjustment state for the filter 2.

It is possible with the above arrangement to eliminate the conventional frequency sweeping, while simplifying the circuit structure and shortening the time otherwise necessary for adjustment. In addition it is possible to obtain the optimum filter adjustment data with high accuracy by a simpler structure comprising a comparator 6 adapted for detecting the crossing point of the reference level by the filter output, with the monitoring of the characteristic curve being also eliminated, while the circuit can be easily adapted to automatic adjustment with the use of buses.

The present invention is not limited to the above embodiment but may also be applied to, for example, an adjustment of the cut-off frequency of a BPF. Referring now to FIG. 7, changeover switches 18A, 18B are operatively interlocked with each other, while the non-inverting terminal Ta of the operational amplifier 11 and the other terminal Tc of the capacitor 14 of the second integration capacitance are connected in common to a common terminal of the changeover switch 18A. The other terminal Ta of the capacitor 12 as the second integration capacitance is connected to a common terminal of the changeover switch 18B while the select terminal b of the changover switch 18A and the select terminal a of the changeover switch 18B are connected in common to a signal input terminal 16, while the select terminal a of the changeover switch 18A and the select terminal b of the changeover switch 18B are connected in common and grounded. The circuit design is otherwise the same as that of FIG. 1 so that the same or equivalent parts are denoted by the same reference numerals and the corresponding description is omitted for simplicity.

With the arrangement of FIG. 7, both the changeover switches 18A, 18B are connected to the select terminal a, during the normal usage of the circuit, for constituting the BPF having the frequency characteristics shown by the solid line in FIG. 8. The changeover switches 18A, 18B are connected to the select terminal b of the changeover switches 18A, 18B during filter adjustment for commutation to the trap filter characteristics as indicated by the chain dotted line in FIG. 8 similarly to the embodiment of FIG. 1. In this manner, the portion proper to the characteristic curve may be demonstrated in the form of a dip that may be detected easily to permit filter adjustment to be conducted more easily and with improved accuracy.

FIG. 9 shows in a block circuit diagram the filter circuit according to a further modification of the present invention and illustrates the so-called biquad filter of the double integration type that is built into an IC. In the present embodiment, the value of Q in, for example, a BPF, is enlarged only during filter adjustment to increase the sharpness of the peak portion proper to the filter characteristics to facilitate the detection of the frequency of the peak portion and hence to facilitate the filter adjustment.

The biquad filter shown in FIG. 9 is a so-called active filter consisting of a series circuit of a first integrator composed of a first operational amplifier 11 and a capacitor as integration capacitance 12 and a second integrator composed of a second operational amplifier 13 and a second capacitor 14. The output of the operational amplifier 11 is supplied to a non-inverting terminal of the operational amplifier 13, the output of the operational amplifier 13 is fed back to an inverting input terminal of the operational amplifier 11, and the output of the operational amplifier 13 is fed back to the inverting input terminal of the operational amplifier 13 through a feedback circuit 15 having a feedback factor $\beta$. The feed back circuit 15 is composed of a voltage divider consisting of resistors $R_1$ and $R_2$, with the resistor $R_2$ being connected to the output terminal of the operational amplifier 13.

As essential portions of the present embodiment, a series circuit consisting of a resistor $R_3$ and a switch SW is connected parallel to the resistor $R_1$. The feedback factor $\beta$ of the feedback circuit 15 is commutated by the turning on and off of the switch SW for commutating only the value of Q of the filter.

It will be noted herein that a variety of filter characteristics such as those of a BPF, LPF, HPF or a trap filter may be achieved according as the non-inverting input terminal of the operational amplifier 11 or the capacitors 12, 14 are fed with input signals or grounded. In the embodiment shown in FIG. 9, both the non-inverting terminal of the operational amplifier 11 and the capacitor 14 are grounded, while the input signals are supplied from the signal source SG to the capacitor 12 and to a resistor $R_1$ of the feedback circuit 15 through the input terminal 16 for constituting the BPF. The frequency characteristics of the BPF are represented by the transfer function $$\beta/(s^2+\beta s+1)$$

wherein $S = j\omega/\omega_o$, $\omega_o 32\ 2\pi f_o$, $\omega = 2\pi f$ and $f_0$ is the cut-off frequency of the band pass filter.

It is noted that, in the circuit configuration shown in FIG. 9, the feedback factor $\beta$ in the feedback circuit 15 is commutated in accordance with the turning on and off of the switch SW in the feedback circuit 15, such that the feedback factor $\beta_{OFF}$ during the time the switch SW is turned off is given by $$\beta_{OFF} = R_1/(R_1+R_2)$$

while the feedback factor $\beta_{ON}$ during the time the switch SW is turned on is given by $$\beta_{ON} = \frac{R_1//R_3}{(R_1//R_3) + R_2}$$

wherein $R_1//R_3 = R_1R_3/(R_1+R_3)$. As to the values of Q for these states $Q_{OFF}$ and $Q_{ON}$, $Q_{OFF}=1/\beta_{OFF}$ and $Q_{ON}=1/\beta_{ON}$, so that $Q_{OFF}<Q_{ON}$.

Thus, during the normal usage of the circuit, the switch SW is turned off to realize the BPF having the frequency characteristics as indicated by the solid line in FIG. 10. During filter adjustment, the switch SW is turned on for commutating the filter characteristics to those of a BPF having a larger value of Q as indicates by the double-dotted chain line in FIG. 10, while the level of the output signal from the output terminal 17 is measured by a level measuring device, such as a level meter, for detecting the peak portion proper to the characteristic curve, and the filter adjustment is performed until the peak frequency $f_0$ is coincident with the prescribed target frequency. In this manner, adjustment of the BPF can be made easily and accurately by increasing the value of Q for enhancing the sharpness of the peak portion only during the adjustment, despite the fact that the value of Q of the BPF is low and hence it is difficult to identify its peak frequency as may be seen from the frequency characteristics as indicated by the solid line in FIG. 10.

It can also be applied to adjustment of the cut-off frequency of a low pass filter to increase the value of Q of the filter. In this case, input signals are supplied to a non-inverting input terminal of the operational amplifier 11 of the first integrator through the input terminal 16, while both the capacitors 12, 14 of the integration capacitances of the first and second integrators and the resistor $R_1$ of the feedback circuit 15 are grounded, for constituting the LPF, a series circuit consisting of the resistor $R_3$ and the switch SW is connected in parallel with the resistor $R_1$, this switch SW being turned on and off to commutate the value of Q. Thus, during normal usage of the circuit, the switch SW is turned off to realize the LPF characteristics as indicated by the solid line in FIG. 12. During filter adjustment, the switch SW is turned on to elevate the value of Q to produce a peak in the vicinity of the cut-off frequency $f_0$ of the characteristic curve of the LPF as indicated by the double-dotted chain line in FIG. 12 for facilitating the detection of the cut-off frequency $f_0$. The circuit design is otherwise the same as that shown in FIG. 9 so that the same or equivalent parts are indicated by the same reference numerals and the corresponding description is omitted for simplicity.

It is to be noted that various other modifications can be made within the spirit and the scope of the present invention.

What is claimed is:

1. A filter circuit having an adjusting feature comprising:
    a pair of integrators, each consisting of an amplifier having first and second input terminals and an output circuit, each said output circuit having an output terminal, each said integrator having an integration capacitance connected to said output circuit, the output terminal of said amplifier of a first one of said integrators being connected to the first input terminal of said amplifier of a second one of said integrators and the output terminal of said amplifier of said second integrator being connected to the first input terminal of said amplifier of said first integrator and to the second input terminal of said amplifier of said second integrator; and
    switch means connected with one of the input terminals of said amplifier of one of said first and second integrators for commutating the characteristics of said filter circuit, and means responsive to a control signal for selectively operating said switch means so that said filter may be adjusted in a first position of said switch and operated in a second position of said switch, wherein said switch means is commutated so as to change the shape of the characteristic curve of said filter circuit to a curve having a prominent peak or valley at a predetermined frequency, whereby said predetermined frequency is emphasized more with one shape than with another shape.

2. A filter circuit according to claim 1, wherein said filter circuit includes means responsive to a second control signal for adjusting the characteristics of said filter circuit without changing the shape of the characteristic curve while said switch means is operated.

3. A filter circuit according to claim 2, including input supplying means for supplying a constant frequency input signal to the second input terminal of said amplifier of one of said integrators.

4. A filter circuit according to claim 3, wherein the output terminal of the integration capacitance of said first integrator is connected to a ground terminal, and including means for connecting the second input terminal of said amplifier of said second integrator to a ground terminal, said input supplying means connecting the second input terminal of said amplifier of said first integrator to receive said constant frequency input signal, said switch means is adapted for selectively connecting the output terminal of the integration capacitance of said second integrator to the second input terminal of said amplifier of said first integrator or to said ground terminal.

5. A filter circuit according to claim 3, wherein the second input terminal of said amplifier of said second integrator is connected to the integration capacitance of said first integrator, said switch means is comprised of a first switch unit adapted for selectively connecting the second input terminal of said amplifier of said first integrator to said ground terminal or to said constant frequency input signal, and a second switch unit for selectively connecting the integration capacitance of said first integrator to said ground terminal or to said constant frequency input signal, said first and second switch units being operated while said switch means is operated to connect said constant frequency input signals to the second input of said first integrator and to connect the integration capacitance of the first integrator to ground.

6. A filter circuit according to claim 2, wherein said switch means includes a switch unit for commutating the value of Q of said filter circuit, said switch unit being commutated for increasing the value of Q, during adjustment of said filter circuit.

7. A filter circuit according to claim 6, including input supplying means for supplying a constant frequency input signal to one of said integrators.

8. A filter circuit according to claim 7, wherein the integration capacitance of said first integrator is connected to said constant frequency input signal, said switch means including a resistor circuit connected to the output terminal and to the second input terminal of said amplifier of said second integrator and to a terminal of the integration capacitance of said first integrator, said switch unit commutating the value of resistance of said resistor circuit.

9. A filter circuit according to claim 7, wherein the second input terminal of said first integrator is connected to said constant frequency input signal, and said switch means includes a resistor circuit connected to the output terminal of said amplifier of said second integrator and to ground, said switch unit commutating the value of resistance of said resistor circuit.

10. A filter circuit according to claim 2, wherein said switch means is operated for commutating the filter characteristics of said filter from a low pass filter to a trap filter having a trap frequency, during adjustment of said filter circuit.

11. A filter circuit according to claim 10, wherein said trap frequency is equal to the cut off frequency of said low pass filter.

12. A filter circuit according to claim 2, wherein said switch means is operated for commutating the filter characteristics of said filter from a bandpass filter to a trap filter, during adjustment of said filter circuit.

13. A filter circuit according to claim 12, wherein said trap frequency is equal to the center frequency of said bandpass filter.

14. A method of changing the characteristics of a filter circuit having a pair of integrators, said filter circuit having selectively operable switch means having first and second positions, comprising the steps of;
supplying a constant frequency input signal to said filter circuit,
supplying a control signal to operate said switch means to said first position for commutating the shape of the characteristic curve of said filter circuit to a shape having a prominent peak or valley at a predetermined frequency, whereby said predetermined frequency is emphasized more with one shape than with the normal shape,
obtaining an output signal from said filter circuit in response to said constant frequency input signal, to enable adjustment of said filter circuit, and
operating said switch to its second position to enable normal operation with said normal shape characteristic curve.

15. The method according to claim 14, including the step of adjusting the frequency response of said filter circuit without changing the shape of the characteristic curve, while said switch means is operated.

16. The method according to claim 14, including the step of changing the characteristics of said filter circuit from a low pass filter to a trap filter having a trap frequency equal to the cut off frequency of said low pass filter in response to said control signal.

17. The method according to claim 14, including the step of changing the characteristics of said filter circuit from a band pass filter to a trap filter having a trap frequency equal to the center frequency of said band pass filter.

18. The method according to claim 14, including the step of changing the Q of said filter.

19. The method according to claim 18, wherein said filter circuit comprises a low pass filter, whereby changing the Q of said filter circuit changes the frequency response in the vicinity of the cut-off frequency of said filter circuit.

* * * * *